(12) United States Patent
Oh

(10) Patent No.: US 10,607,970 B2
(45) Date of Patent: Mar. 31, 2020

(54) LED DISPLAY MODULE

(71) Applicant: LUMENS CO., LTD., Yongin-si, Gyeonggi-do (KR)

(72) Inventor: Seunghyun Oh, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/242,203

(22) Filed: Jan. 8, 2019

(65) Prior Publication Data
US 2019/0221604 A1    Jul. 18, 2019

(30) Foreign Application Priority Data
Jan. 17, 2018    (KR) .................. 10-2018-0005866

(51) Int. Cl.
*H01L 25/075*    (2006.01)
*H01L 33/62*    (2010.01)

(52) U.S. Cl.
CPC .......... *H01L 25/0753* (2013.01); *H01L 33/62* (2013.01)

(58) Field of Classification Search
CPC .................................. H01L 25/0753
See application file for complete search history.

(56) References Cited

U.S. PATENT DOCUMENTS

2018/0190184 A1*    7/2018   Kim .................. H01L 25/0753

* cited by examiner

*Primary Examiner* — Daniel P Shook
(74) *Attorney, Agent, or Firm* — Mei & Mark LLP

(57) ABSTRACT

An LED display module is disclosed. The LED display module includes: a micro-LED array including a plurality of pixel units arrayed in a matrix with rows and columns, each of the pixel units including a red LED, a green LED, and a blue LED; a substrate including a top layer on which the pixel units are mounted, a first layer located under the top layer, and a second layer located under the first layer; and pairs of electrode pads disposed on the substrate and to which first electrodes and second electrodes of the LEDs of the pixel units are connected. The distances between peripheral portions of the paired electrode pads are longer than the distances between central portions thereof.

20 Claims, 6 Drawing Sheets

(b) III-III section (a) TOP (b) Layer1 (L10)

(c) Layer2 (L20)

(a)

(b) III-III section (c) IV-IV section

LED DISPLAY MODULE

BACKGROUND OF THE INVENTION

1. Field of the Invention

The present invention relates to an LED display module, and more specifically to an LED display module for a full-color LED display device including pixel units, each of which includes LEDs emitting light of different wavelengths, wherein the distances between electrode patterns formed on a substrate can be more efficiently secured, the number of layers constituting the substrate can be reduced, and routing can be more simply implemented.

2. Description of the Related Art

Display devices using light emitting diodes (LEDs) as backlight sources have been proposed. Particularly, full-color LED display devices have been proposed in which LEDs emitting light of different wavelengths are grouped into pixels and the pixels are arrayed in a matrix. Each of the pixels consists of red, green, and blue LEDs or red, green, blue, and white LEDs. In a package type full-color LED display device, packages structures, each of which includes a red LED, a green LED, and a blue LED, are mounted on a substrate. However, the intervals between the constituent LEDs of each pixel are above a predetermined level, making it difficult to obtain high-quality resolution.

Single-pixel LED packages have been proposed in which red, green, and blue LED chips are mounted to constitute one pixel. Multi-pixel LED packages have also been proposed in which several pixels are mounted in one package. Such single-pixel LED packages or multi-pixel LED packages require a large number of terminals to individually drive red, green, and blue LEDs. The large number of terminals involves many limitations in implementing routing, increases the possibility of shorting between interconnection lines, and causes limitations in designing circuits on PCBs mounted with LED packages.

The formation of electrode patterns on a substrate in the construction of a conventional LED display module significantly limits the yield of the LED display module. Several thousands to millions of pixels are required per unit module and a plurality of electrode pads should be formed corresponding to the number of LEDs in one pixel. That is, there are many limiting factors associated with the sizes and intervals of the plurality of electrode pads.

FIGS. 1 to 3 illustrate problems caused by electrode pads in the construction of a conventional LED display module. Specifically, FIG. 1 illustrates one pixel unit in an LED display module used for the fabrication of a conventional LED display device, FIG. 2 is a vertical cross-sectional view taken along line I-I of FIG. 1, and FIG. 3 illustrates layers L1, L2, and L3 in the vertical cross-sectional view of FIG. 2 when extended to the LED display module including arrays of a plurality of pixel units.

Referring to FIGS. 1 to 3, a red LED PL1, a green LED PL2, and a blue LED PL3 are mounted on corresponding electrode pads in one pixel unit. The electrode pads mounted with the red LED PL1 are designated by reference numerals R1a and R1b, the electrode pads mounted with the green LED PL2 are designated by reference numerals G1a and G1b, and the electrode pads mounted with the blue LED PL3 are designated by reference numerals B1a and B1b. As illustrated, each of the electrode pads has a substantially rectangular shape in cross section.

FIG. 2 is a cross-sectional view of the pixel unit, specifically a vertical cross-section taken along line I-I of FIG. 1. A substrate has a multilayer structure consisting of a top layer TOP, a first layer L1, a second layer L2, and a third layer L3 formed in this order from the top to the bottom. For matrix array and interconnection, vias RV1, GV1, and BV1 are formed to connect the left electrode pads R1a, G1a, and B1a formed on the top layer TOP to interconnection lines. The left electrode pads R1a, G1a, and B1a are interconnected such that an electric current is allowed to flow into a drive IC (not illustrated) to individually control the LEDs. To this end, cathode terminals of the LEDs are connected to the left electrode pads. Specifically, the cathode terminals of the red LED PL1, the green LED PL2, and the blue LED PL3 in the pixel unit are connected to R1a, G1a, and B1a, respectively, such that the LEDs are individually controlled by the pixel driving IC (not illustrated).

The right electrode pads R1b, G1b, and B1b corresponding to the LEDs PL1, PL2, and PL3 in the pixel unit are connected to interconnection lines through which scan signals are received. Anode terminals of the LEDs PL1, PL2, and PL3 in the pixel unit are connected to the right electrode pads R1b, G1b, and B1b, respectively.

The first layer L1 is located under the top layer TOP. A B contact BC1 is formed at a position of the first layer L1 corresponding to the B electrode pad B1a disposed on the top layer TOP. Referring to FIG. 3 illustrating an array structure of the plurality of pixel units, B contacts BC1, BC2, and BC3 are formed at positions corresponding to the B electrode pads and a B interconnection line 11 is formed to connect the B contacts BC1, BC2, and BC3 to one another. The B contacts BC1, BC2, and BC3 are connected to the corresponding B electrode pads B1, B2, and B3 through B vias BV1. The second layer L2 is located under the first layer L1. G contacts GC1, GC2, and GC3 are formed at positions of the second layer L2 corresponding to the G electrode pads G1, G2, and G3 disposed on the top layer and a G interconnection line 12 is formed to connect the G contacts GC1, GC2, and GC3 to one another. The G contacts GC1, GC2, and GC3 are connected to the corresponding G electrode pads G1, G2, and G3 through G vias GV1. The third layer L3 is located under the second layer L2. R contacts RC1, RC2, and RC3 are formed at positions of the third layer L3 corresponding to the R electrode pads R1, R2, and R3 disposed on the top layer and an R interconnection line 13 is formed to connect the R contacts RC1, RC2, and RC3 to one another. The R contacts RC1, RC2, and RC3 are connected to the corresponding R electrode pads R1, R2, and R3 through R vias RV1. The electrode pads R1b, G1b, and B1b connected with the anode terminals in the pixel units are disposed such that scan signals are received in rows through row-wise interconnections (not illustrated) formed in one of the first to third layers.

In the construction of the conventional LED display module, the LEDs PL1, PL2, and PL3 (specifically, the electrodes of the LEDs) of the pixel units are electrically connected to and mounted on the electrode pads R1a, R1b, G1a, G1b, B1a, and B1b by a reflow process using solder balls (SB1, SB2, and SB3 in FIG. 2).

However, the solder balls melted during the reflow process tend to flow into edge areas (E of FIG. 1) of the electrode pads formed on the substrate due to the rectangular shape of the electrode pads, and as a result, the LEDs mounted on the electrode pads are tilted. This tilting leads to the formation of defects and low yield of the LED display module.

A multilayer substrate may be used for efficient interconnection. In this case, interconnection between the layers of the substrate through vias should also be taken into consideration. That is, considering the relationship between electrode pads and corresponding vias connected thereto, the outer circumferences of the cross sections of the vertical vias should be within the outer circumferences of the electrode pads such that the underlying vias are not misaligned with the overlying electrode pads. However, a reduction in the cross-sectional area of the electrode pads is insufficient to solve the problem that the LEDs are tilted during reflow.

Furthermore, the increased number of the layers in the multilayer substrate and the small intervals between interconnection lines within the layers cause frequent shorting and make the implementation of routing excessively complex.

Thus, there is a need in the art to provide a solution to the multiple problems of the prior art.

SUMMARY OF THE INVENTION

The present invention has been made in an effort to effectively solve the problems encountered in conventional LED display modules, and it is an object of the present invention to provide an LED display module in which solder balls melted during a reflow process do not flow into edge areas of electrode pads, whose cross-sectional shape is rectangular in conventional LED display modules, to prevent LEDs mounted on the electrode pads from being tilted and the electrode pads can be effectively connected to corresponding vias in a multilayer substrate.

An LED display module according to one aspect of the present invention includes: a micro-LED array including a plurality of pixel units arrayed in a matrix with rows and columns, each of the pixel units including a red LED, a green LED, and a blue LED; a substrate including a top layer on which the pixel units are mounted, a first layer located under the top layer, and a second layer located under the first layer; and pairs of electrode pads disposed on the substrate and to which first electrodes and second electrodes of the LEDs of the pixel units are connected, wherein the distances between peripheral portions of the paired electrode pads are longer than the distances between central portions thereof.

According to one embodiment, the pairs of electrode pads include a plurality of first electrode pads to which the first electrodes of the LEDs of the pixel units are connected and a plurality of second electrode pads to which the second electrodes of the LEDs of the pixel units are connected.

According to one embodiment, the plurality of first electrode pads corresponding to each pixel unit include a first R electrode pad, a first G electrode pad, and a first B electrode pad; and the plurality of second electrode pads corresponding to each pixel unit include a second R electrode pad, a second G electrode pad, and a second B electrode pad.

According to one embodiment, the first electrode pads corresponding to one pixel unit and the first electrode pads corresponding to another pixel unit adjacent in the row direction receive scan signals applied through a common row-wise interconnection line; and the second electrode pads corresponding to one pixel unit are connected to the second electrode pads corresponding to another pixel unit adjacent in the column direction through a common column-wise interconnection line.

According to one embodiment, the pairs of electrode pads are disposed on the top layer.

According to one embodiment, the column-wise interconnection lines are formed on the second layer.

According to one embodiment, the column-wise interconnection lines are connected to the first electrode pads through first vias.

According to one embodiment, the row-wise interconnection lines are formed on the first layer.

According to one embodiment, the row-wise interconnection lines are connected to the second electrode pads through second vias.

According to one embodiment, the second R electrode pads adjacent in the column direction are linearly aligned, the second G electrode pads adjacent in the column direction are linearly aligned, and the second B electrode pads adjacent in the column direction are linearly aligned.

According to one embodiment, each of the column-wise interconnection lines includes three sub-lines consisting of an R line, a G line, and a B line.

According to one embodiment, the second R electrode pads adjacent in the column direction are connected to the R line, the second G electrode pads adjacent in the column direction are connected to the G line, and the second B electrode pads adjacent in the column direction are connected to the B line.

According to one embodiment, the outer circumference of the upper end of each of the first vias is within the outer circumference of the corresponding first electrode pad in the connection portion between the first electrode pad and the first via.

According to one embodiment, each of the first electrode pads has a circular or n-gonal shape (n is a natural number of 5 or greater) in cross section.

According to one embodiment, the outer circumference of the upper end of each of the second vias is within the outer circumference of the corresponding second electrode pad in the connection portion between the second electrode pad and the second via.

According to one embodiment, each of the second electrode pads has a circular or n-gonal shape (n is a natural number of 5 or greater) in cross section.

According to one embodiment, the first and second electrode pads corresponding to each pixel unit are arrayed in the row and column directions, respectively.

According to one embodiment, the number of the row-wise interconnection lines corresponds to the number of the rows.

According to one embodiment, scan signals are sequentially applied to the common row-wise interconnection lines in response predetermined scan cycles.

According to one embodiment, the number of the column-wise interconnection lines corresponds to the number of the columns.

The LED display module of the present invention is free from the problems encountered in conventional LED display modules including electrode pads whose cross-sectional shape is rectangular. Specifically, the solder balls melted during a reflow process do not flow into edge areas of the electrode pads to prevent tilting of the LEDs mounted on the electrode pads, resulting in high yield of the LED display module.

In addition, the number of the layers in the multilayer substrate of the LED display module according to the present invention is reduced and the possibility of shorting between the interconnection lines can be reduced. Furthermore, routing can be more simply implemented in the LED display module of the present invention than in conventional LED display modules.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Embodiments of the present invention will now be described with reference to the accompanying drawings. It should be noted that the drawings and embodiments are simplified and illustrated such that those skilled in the art can readily understand the present invention.

Figure 4:
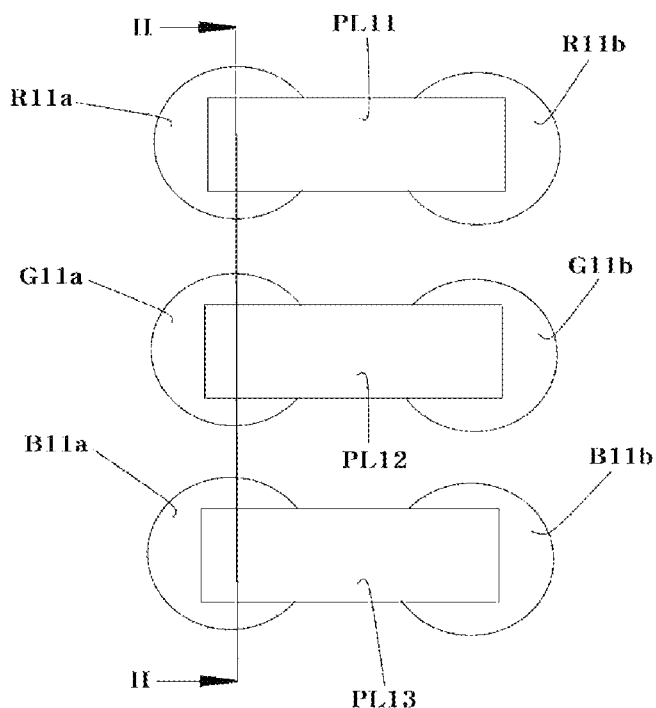
FIG. 4 illustrates one pixel unit of a display module according to one embodiment of the present invention.
Figure 5:
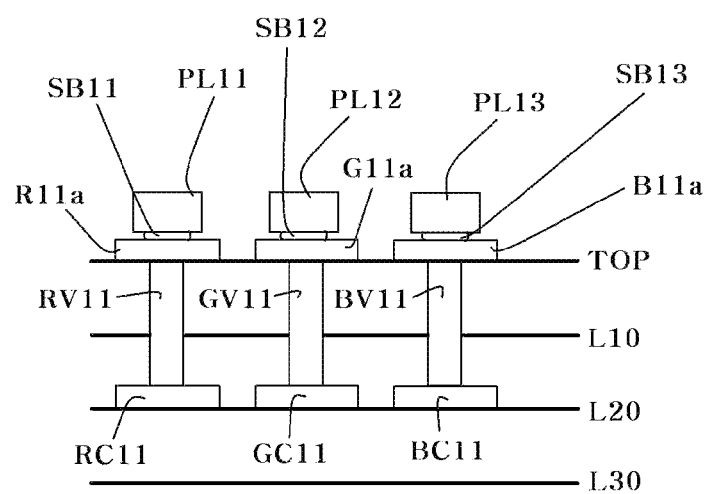
FIG. 5 is a vertical cross-sectional view taken along line II-II of FIG. 4.
Figure 6:
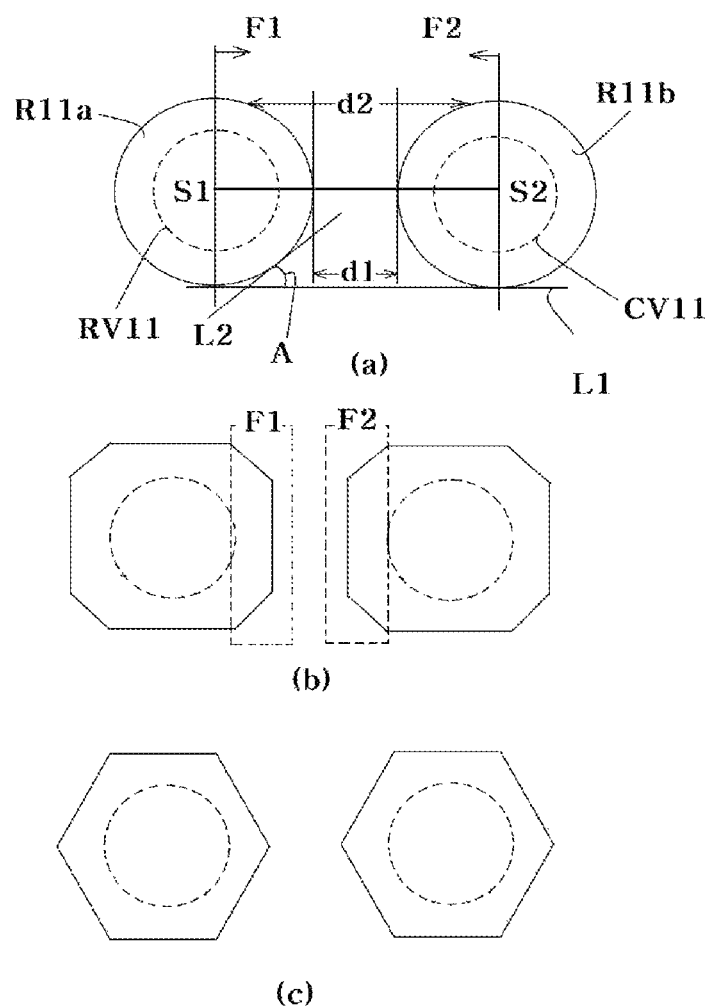
FIG. 6 illustrates exemplary electrode pads of the display module of FIG. 4.
Figure 7:
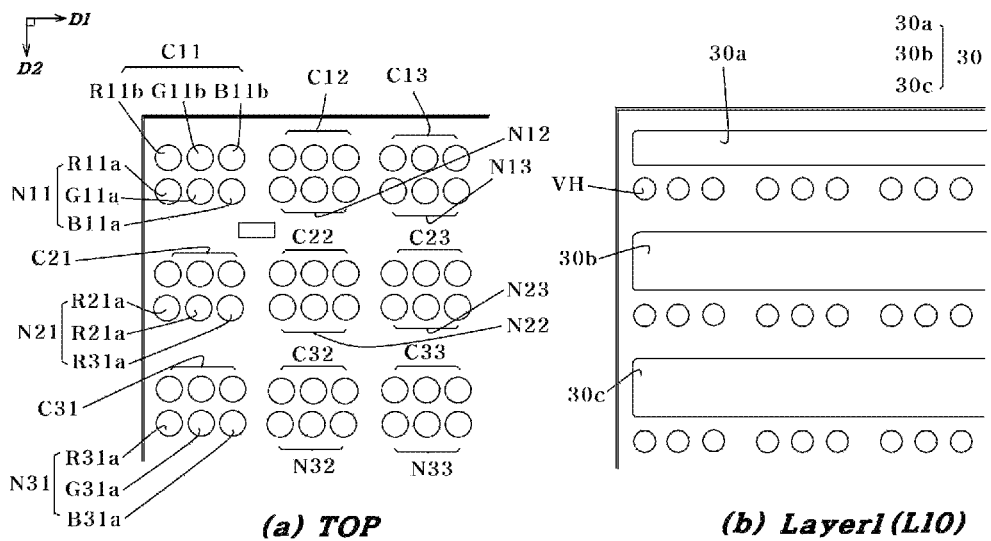
FIG. 7 illustrates a top layer TOP, a first layer L10, and a second layer L20 in the vertical cross-sectional view of FIG. 5 when extended to the LED display module including arrays of a plurality of pixel units.
Figure 7:
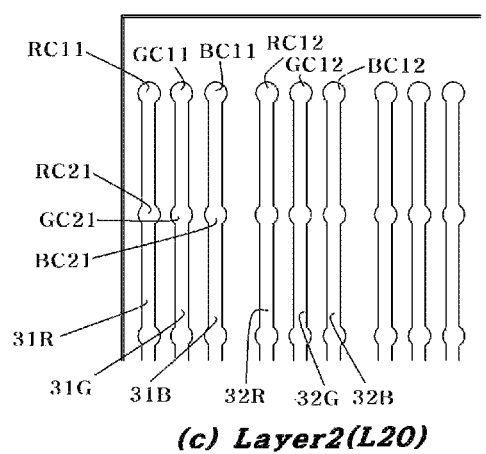
Figure 8:
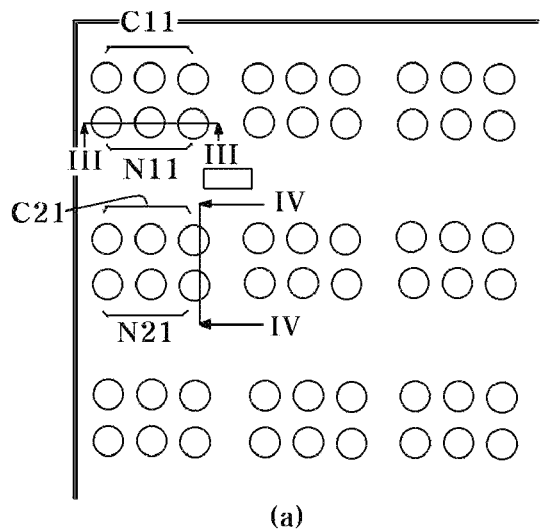
FIG. 8 illustrates (a) the top layer of FIG. 7, (b) a cross-sectional view taken along line of (a), and (c) a cross-sectional view taken along line IV-IV of (a).
Figure 8:
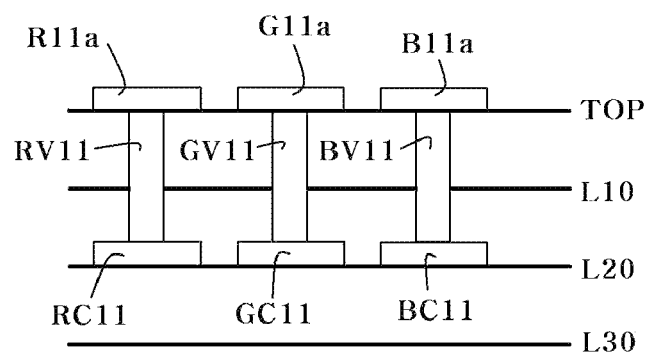
Figure 8:
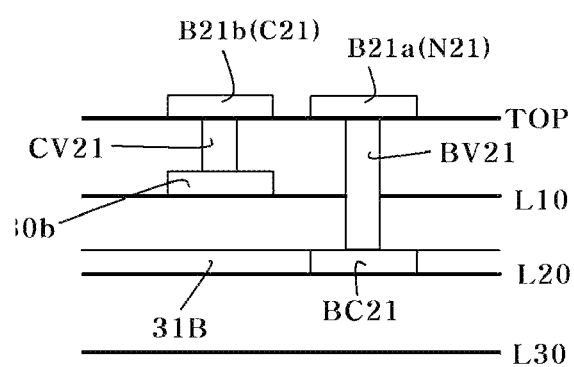

FIG. 4 illustrates one pixel unit of a display module according to one embodiment of the present invention, FIG. 5 is a vertical cross-sectional view taken along line of FIG. 4, FIG. 6 illustrates exemplary electrode pads of the display module of FIG. 4, FIG. 7 illustrates a top layer TOP, a first layer L10, and a second layer L20 in the vertical cross-sectional view of FIG. 5 when extended to the LED display module including arrays of a plurality of pixel units, and FIG. 8 illustrates (a) the top layer of FIG. 7, (b) a cross-sectional view taken along line of (a), and (c) a cross-sectional view taken along line IV-IV of (a).

An LED display module of the present invention includes: a micro-LED array including a plurality of pixel units arrayed in a matrix with rows and columns, each of the pixel units including a red LED, a green LED, and a blue LED; a substrate including a top layer on which the pixel units are mounted, a first layer located under the top layer, and a second layer located under the first layer; and pairs of electrode pads disposed on the substrate and to which first electrodes and second electrodes of the LEDs of the pixel units are connected.

Each of the pixel units includes a red LED PL11, a green LED PL12, and a blue LED PL13, as illustrated in FIG. 4. The LEDs PL11, PL12, and PL13 are mounted on the corresponding pairs of electrode pads. Specifically, the red LED PL11 is mounted on the pair of R electrode pads R11a and R11b, the green LED PL12 is mounted on the pair of G electrode pads G11a and G11b, and the blue LED PL13 is mounted on the pair of B electrode pads B11a and B11b.

Figure 1:
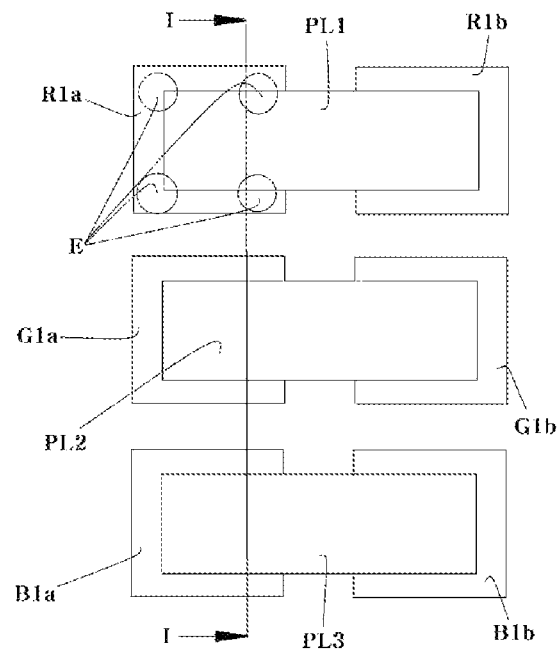
FIG. 1 illustrates one pixel unit in a conventional display module.
Figure 2:
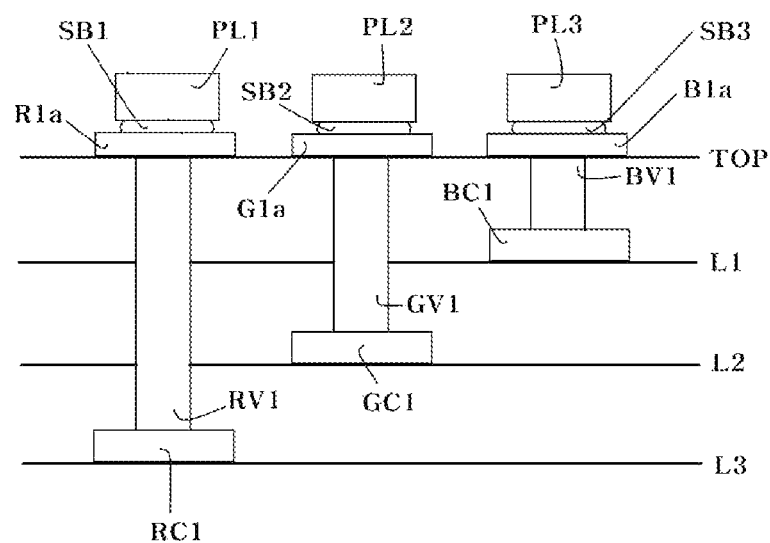
FIG. 2 is a vertical cross-sectional view taken along line I-I of FIG. 1.
Figure 3:
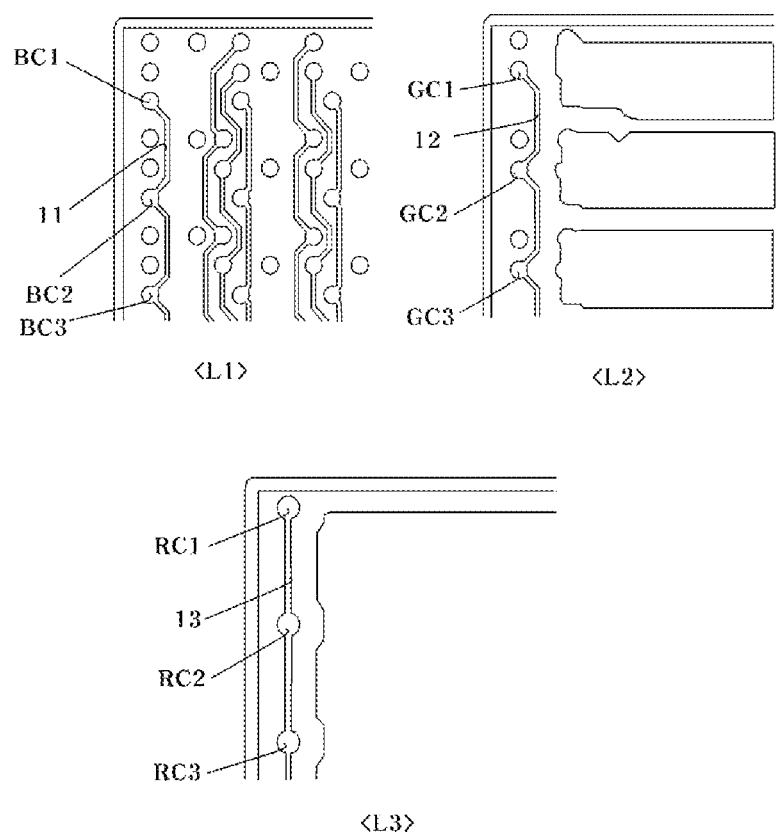
FIG. 3 illustrates layers L1, L2, and L3 in the vertical cross-sectional view of FIG. 2 when extended to the LED display module including arrays of a plurality of pixel units.

The pairs of electrode pads R11a, R11b, G11a, G11b, B11a, and B11b are divided into first electrode pads R11a, G11a, and B11a and second electrode pads R11b, G11b, and B11b. Specifically, the pair of R electrode pads R11a and R11b are divided into a first electrode pad R11a to which a first electrode of the red LED PL11 is connected and a second electrode pad R11b to which a second electrode of the red LED PL11 is connected; the pair of G electrode pads G11a and G11b are divided into a first electrode pad G11a to which a first electrode of the green LED PL12 is connected and a second electrode pad G11b to which a second electrode of the green LED PL12 is connected; and the pair of B electrode pads B11a and B11b are divided into a first electrode pad B11a to which a first electrode of the blue LED PL13 is connected and a second electrode pad B11b to which a second electrode of the blue LED PL13 is connected. Considering the construction of the LED display module in which the pixel units are arrayed in a matrix with rows and columns, the plurality of pairs of electrode pads on which the pixel units are mounted should be disposed at substantially the same intervals and have the same size in limited areas on the substrate. The size of the LEDs should also be taken into consideration. For these reasons, the size of the electrode pads is significantly limited. When it is desired to reduce the size of the electrode pads, connection portions between vias formed in the multilayer substrate and the electrode pads should also be taken into consideration for efficient interconnection. In the case where the electrode pads are increased in size or have a rectangular shape in cross section, as in conventional electrode pads, solder balls flow into edges (see "E" of FIG. 1) of the electrode pads during a reflow process, as mentioned above. As a result, the LED chips mounted on the electrode pads are tilted, seriously affecting the yield of the LED display module.

Thus, the LED display module of the present invention is designed such that when the pairs of electrode pads (for example, R11a and R11b) are arranged on the substrate, the distances between peripheral portions of the paired electrode pads are longer than the distances between central portions thereof.

Each of the pairs of electrode pads to which the first electrodes and the second electrodes of the LEDs of the corresponding pixel units are connected include facing portions. The distances between the facing portions of each of the pairs of electrode pads are not constant and are shorter than the distances between central portions thereof, unlike in conventional LED display modules including electrode pads whose cross-sectional shape is quadrangular. Here, the facing portions refer to portions of the paired electrode pads (for example, the first electrode pad R11a and the second electrode pad R11b) facing each other. The facing portions are defined as the outer circumferences F1 and F2 of the paired electrode pads close to each other where a line L1 connecting the lowest points of the electrode pads forms an acute angle A with the tangent L2 to a point on the outer circumferences of the electrode pads, as illustrated in FIG. 6. The angle A is measured in the counterclockwise direction from the line connecting the lower ends of the electrode pads and is measured in the clockwise direction from the line connecting the upper ends of the electrode pads in the drawing. The distance between the central portions is defined as the distance d1 between two points in the facing portions of the electrode pads on a line connecting the central portions of the electrode pads. That is, d1 is the shortest distance between the electrode pads. The first electrode pad R11a and the second electrode pad R11b may be circular in cross section, as illustrated in (a) of FIG. 6. In this case, when each of the electrode pads R11a and R11b is divided into two by a vertical line passing its center, the facing portions are the right half of the outer circumference of the first electrode pad R11a and the left half of the outer circumference of the second electrode pad R11b. When the electrode pads are circular in cross section, as illustrated in (a) of FIG. 6, or have corners facing each other, the distance d1 between the central portions is defined by only one straight line. Alternatively, the first electrode pad R11a and the second electrode pad R11b may be polygonal in cross section, as illustrated in (b) of FIG. 6. In this case, several shortest distances d1 exist between some areas of the facing portions of the electrode pads and are also defined as the distances between the central portions of the electrode pads. When the electrode pads are polygonal in cross section, as illustrated in (b) and (c) of FIG. 6, the facing portion of each of the electrode pads accounts for less than half of the outer circumference of the electrode pad. The peripheral portions refer to areas of the facing portions other than the portions having the shortest distance d1. The distance between the peripheral portions is relatively long compared to the distance between the central portions.

A vertical cross-sectional view of the multilayer substrate taken along line II-II of FIG. 4 is illustrated in FIG. 5. Referring to FIG. 5, the first electrode pads R11a, G11a, and B11a are located under the LEDs PL11, PL12, and PL13 constituting one pixel unit, respectively. Here, R11a, G11a, and B11a are referred to as a first R electrode pad, a first G electrode pad, and a first B electrode pad, respectively, which are used to distinguish the first electrode pads from one another. The first electrode of the red LED PL11 is connected to the first R electrode pad R11a, the first electrode of the green LED PL12 is connected to the first G electrode pad G11a, and the first electrode of the blue LED PL13 is connected to the first B electrode pad B11a. Although not illustrated, the same also applies to the connection structures between the second electrodes of the LEDs and the second electrode pads. However, connections between vias and interconnection lines formed under the electrode pads are different from the above, which will be explained with reference to (c) of FIG. 8. The first electrode and the second electrode of each of the LEDs may be a cathode terminal and an anode terminal, respectively.

The pairs of electrode pads are formed on the top layer TOP, row-wise interconnection lines (not illustrated) are formed on the first layer L10, and column-wise interconnection lines (not illustrated) are formed on the second layer L20. The LED display module includes first vias RV11, GV11, and BV11 connecting the column-wise interconnection lines to the first electrode pads R11a, G11a, and B11a, respectively, and second vias (see CV21 in (c) of FIG. 8) connecting the row-wise interconnection lines to the second electrode pads. In FIG. 5, RC11, GC11, and BC11 are contacts for connection to the column-wise interconnection lines and SB11, SB12, and SB13 are solder balls for electrical connection between the first electrodes of the LEDs PL11, PL12, and PL13 and the first electrode pads R11a, G11a, and B11a formed on the top layer TOP through a reflow process, respectively. Although not illustrated, the same also applies to the connection structures between the second electrodes of the LEDs PL11, PL12, and PL13 and the second electrode pads.

Some examples of the pairs of electrode pads are illustrated in FIG. 6. Each of the paired electrode pads illustrated in (a) of FIG. 6 has a circular shape in cross section. Alternatively, each of the paired electrode pads may have a truncated polygonal shape in cross section. For example, each of the paired electrode pads has a truncated square shape in cross section, as illustrated in (b) of FIG. 6. Alternatively, each of the paired electrode pads may have a hexagonal cross-sectional shape whose corners face each other. That is, each of the paired electrode pads may have a shape rather than a rectangular shape in cross section. The paired electrode pads may have such a shape that the distances d1 and d2 between the facing portions are not constant and the distance d1 between the central portions is shorter than the distance between the peripheral portions.

In FIG. 6, the first via RV11 connects the first R electrode pad R11a to the column-wise interconnection line formed on the second layer L2 and the second via CV11 connects the second R electrode pad R11b to the row-wise interconnection line. As mentioned previously, the outer circumferences of the upper ends of the first vias are designed not to exceed the outer circumferences of the first electrode pads even when the pairs of electrode pads are reduced in area. Likewise, the outer circumferences of the upper ends of the second vias are designed not to exceed the outer circumferences of the second electrode pads. The pairs of electrode pads may have various structures other than the structures exemplified in FIG. 6. For example, the pairs of electrode pads may have a pentagonal or higher polygonal shape whose edges are curved.

Next, a structure of the LED display module in which a plurality of pixel units are arrayed in a matrix will be explained with reference to FIGS. 7 and 8. Referring to FIGS. 7 and 8, the LED display module includes a micro-LED array including pixel units arrayed in a matrix with rows in the direction D1 and columns in the direction D2. Each of the pixel units includes a red LED PL11, a green LED PL12, and a blue LED PL13 (see FIG. 4). Herein, the row direction D1 refers to the direction along which scan signals are applied in common when scanned in rows and the column direction D2 refers to the direction for current sinking. The pixel units are connected to one another in the row direction D1 and the LEDs in the pixel units are connected to one another in the column direction D2. Herein, it will be understood that when an element is referred to as being "connected" to another element, the two elements can be directly or electrically connected to each other. The red LED, the green LED, and the blue LED constituting each of the pixels in the LED display module of the present invention are preferably flip-bonded.

The plurality of LEDs of the pixel units are mounted on a substrate in the row direction D1 and the column direction D2. The substrate includes a top layer TOP, a first layer L10 formed under the top layer TOP, and a second layer L20 formed under the first layer L10, which are illustrated in (a), (b), and (c) of FIG. 7, respectively. As illustrated in FIG. 8, the substrate may further include another layer under the second layer L20 for additional interconnection.

In a final full-color LED display device, the pixel units are connected in common in rows to receive scan signals in rows in response to predetermined scan cycles in the row direction D1 and are connected to a driver IC (not illustrated) for current sinking in the column direction D2. The pixel units are connected independently in the column direction D2 such that the LEDs in each pixel unit are controllable individually. It is to be understood that first electrode pads (for example, N11, N21, and N31) mounted with first terminals of the adjacent LEDs are also interconnected in common in the row direction D2. Thus, the full-color LED display device is constructed such that scan signals are received in rows in response to predetermined scan cycles from the top to the bottom or vice versa and the red LEDs, the green LEDs, and the blue LEDs in the pixel units are independently connected in the column direction D2 for current sinking, enabling control over color or brightness.

A detailed discussion of the individual layers will be given below. As illustrated in (a) of FIG. 7, a plurality of second electrode pads C11, C21, C31, . . . and a plurality of second electrode pads N11, N21, N31, . . . are formed on the top layer TOP of the substrate. In each pixel unit, the pairs of electrode pads (for example, C11 and N11) correspond to the red LED, the green LED, and the blue LED, which are mounted in the column direction. As illustrated, the first electrode pads N11 consist of a first R electrode pad R11a, a first G electrode pad G11a, and a first B electrode pad B11a. The second electrode pads C11 consist of a second R electrode pad R11b, a second G electrode pad G11b, and a second B electrode pad B11b. In each pixel, the first electrodes of the LEDs are connected to the first R electrode pad R11a, the first G electrode pad G11a, and the first B electrode pad B11a and the second electrodes of the LEDs are connected to the second R electrode pad R11b, the second G electrode pad G11b, and the second B electrode pad B11b. Here, the first electrodes may be cathode terminals and the second electrodes may be anode terminals.

The second electrode pads R11b, G11b, and B11b mounted with the LEDs constituting one pixel unit and the second electrode pads (for example, C11 and C12) connected with the pixel units adjacent in the row direction D1 receive common scan signals through row-wise interconnection lines (30 in (b)). As illustrated, the first electrode pads R11a, G11a, and B11a mounted with the LEDs constituting one pixel unit and the second electrode pads R11b, G11b, and B11b are arrayed in the row direction D1. The second electrode pads (for example, N11 and N21) adjacent in the column direction D2 are connected to each other through common column-wise interconnection lines (31R, 31G, and 31B in (c)).

Thus, the pairs of first electrode pads and second electrode pads are arrayed in the row direction such that the red LED, the green LED, and the blue LED are arrayed in the row direction D1 in one pixel unit. When the number of pixel units is represented by m*n (where m is the number of columns and n is the number of rows), the number of row-wise interconnection lines (reference numerals 30a, 30b, and 30c in (b) of FIG. 7) is n and the number of column-wise interconnection lines (reference numerals 31R, 31G, 31B, . . . in (c) of FIG. 7) is 3 m.

In order to make the row-wise interconnection lines 30 in the first layer L10 located under the top layer TOP and the column-wise interconnection lines 31R, 31G, and 31B in the second layer L20 located under the first layer L10 compact, it is preferred that the second electrode pads (for example, C11 and C12) adjacent in the row direction D1 are linearly aligned, the R electrode pads (for example, R11a and R21a) of the first electrode pads adjacent in the column direction D2 are linearly aligned in the column direction D2, the G electrode pads (for example, G11a and G21a) of the first electrode pads adjacent in the column direction D2 are linearly aligned in the column direction D2, and the B electrode pads (for example, B11a and B21a) of the first electrode pads adjacent in the column direction D2 are linearly aligned in the column direction D2 in the column direction D2.

The number of the row-wise interconnection lines 30 formed in the first layer L10 illustrated in (b) of FIG. 7 corresponds to the number of the rows. Scan signals are applied in rows in response to predetermined scan cycles through the row-wise interconnection lines 30, and as a result, an operating voltage is supplied to each pixel. The row-wise interconnection lines 30 of the first layer L10 are connected to the second electrode pads of the overlying top layer TOP in rows. The second electrode pads (for example, C21) formed on the top layer TOP are connected to the row-wise interconnection lines (for example, 30b) formed on the first layer L10 through vias CV21 (see the cross-section (c) of FIG. 8). Only one second via CV21 is illustrated in FIG. 8 but a plurality of vias CV21 are provided corresponding to the positions of the second electrode pads because the group of second electrode pads (for example, R11b, G11b, and B11b) and the groups of second electrode pads connected to the other pixel units should be connected to the row-wise interconnection lines of the first layer L10.

The first layer L10 may have via holes VH through which vias (RV11, GV11, and BV11 in (b) of FIG. 8) penetrate to connect the column-wise interconnection lines (for example, 31R, 31G, and 31B) formed on the underlying second layer L20 to the second electrode pads N11, N21, and N31 formed on the overlying top layer TOP.

The second layer L20 is illustrated in (c) of FIG. 7. The column-wise interconnection lines 31R, 31G, 31B, 32R, 32G, 32B, . . . are formed on the second layer L20. The number of the column-wise interconnection lines may correspond to the number of the columns (m) of the pixel units. The number of the column-wise interconnection lines is not in a one-to-one relationship with the number of the columns of the pixels. In (c) of FIG. 7, 3 m interconnection lines are formed such that the LEDs in each pixel can be controlled independently. For example, the m column-wise interconnection lines designated by reference numerals 31R, 31G and 31B are provided in one set. The column-wise interconnection line 31R is an R line, the column-wise interconnection line 31G is a G line, and the column-wise interconnection line 31B is B line. For example, the R electrode pads R11a, R21a, and R31a adjacent in the column direction are connected to the R line 31R, the G electrode pads G11a, G21a, and G31a adjacent in the column direction are connected to the G line 31G, and the B electrode pads B11a, B21a, and B31a adjacent in the column direction are connected to the B line 31B.

For example, contacts (for example, RC11) with relatively wide interconnection widths may be formed in the column-wise interconnection lines (for example, 31R) for improved electrical connection with the first electrode pads (for example, R11a) disposed on the top layer TOP through vias (RV11 in (b) of FIG. 8).

Referring next to FIG. 8, a further explanation will be given of the interconnections among the top layer TOP, the first layer L10, and the second layer L20.

(b) of FIG. 8 is a cross-sectional view taken along line of (a) and explains vertical structures of the first electrode pads R11a, G11a, and B11a. (c) of FIG. 8 is a cross-sectional view taken along line IV-IV of (a) and explains vertical structures of the second electrode pad C21 and the first electrode pad B21a.

As illustrated in the cross-section ((b) of FIG. 8), the first electrode pads R11a, G11a, and B11a are connected to the corresponding contacts RC11, GC11, and BC11 in the column-wise interconnections 31R, 31G, and 31B (FIG. 7) formed on the second layer L20. The contacts RC11, GC11, and BC11 are connected to the first electrode pads R11a, G11a, and B11a through first vias RV11, GV11, and BV11 penetrating the via holes VH (FIG. 7) formed in the first layer L10. That is, each pixel unit is formed in such a manner that the R electrode pad R11a connected with the red LED is connected to the contact RC11 in the column-wise interconnection line 31R formed on the second layer L20 through the first via RV11, the G electrode pad G11a connected with the green LED is connected to the contact GC11 in the column-wise interconnection line 31G formed on the second layer L20 through the first via GV11, and the B electrode pad B11a connected with the blue LED is connected to the contact BC11 in the column-wise interconnection line 31B formed on the second layer L20 through the first via BV11.

As illustrated in the IV-IV cross-section ((c) of FIG. 8), the first electrode pad B21a is connected to the contact BC21 in the column-wise interconnection line 31B formed on the second layer L20, whereas the second electrode pad B21b is connected to the row-wise interconnection line 30b formed on the first layer L10 through the second via CV21. Although only the cross-section of one B21b of the second electrode pads C21 is illustrated in (c) of FIG. 8, the same connections can apply to all second electrode pads. Thus, all second electrode pads are connected to the row-wise interconnection lines formed on the first layer L10 through the first vias. As mentioned earlier, scan signals are applied in rows through the row-wise interconnection lines (30a, 30b, and 30c in FIG. 7) formed on the first layer L10.

In these figures, the numbers of the first electrode pads and the second electrode pads disposed on the top layer TOP, the number of the row-wise interconnection lines formed on the first layer L10, and the number of the column-wise interconnection lines formed on the second layer are may vary (m*n) depending on the size of the LED display device.

Under an assumption that four (2*2) pixel units are arranged in the LED display module, an explanation will be given with reference to FIGS. 7 and 8.

The pixel units are divided into first, second, third, and fourth pixel units. The first pixel unit is adjacent to the second pixel unit in the row direction D1, the third pixel unit is adjacent to the fourth pixel unit in the row direction D1, the first pixel unit is adjacent to the third pixel unit in the column direction D2, and the second pixel unit is adjacent to the fourth pixel unit in the column direction D2.

On a top layer TOP mounted with constituent LEDs of the first to fourth pixel units, a first electrode pad N11 is formed corresponding to the first pixel unit, a first electrode pad N12 is formed corresponding to the second pixel unit, a first electrode pad N21 is formed corresponding to the third pixel unit, and a first electrode pad N22 is formed corresponding to the fourth pixel unit. A second electrode pad C11 corresponding to the first pixel unit, a second electrode pad C12 corresponding to the second pixel unit, a second electrode pad C21 corresponding to the third pixel unit, and a second electrode pad C22 corresponding to the fourth pixel unit are formed on the top layer TOP. Each of the first electrode pads N11, N12, N21, and N22 includes a first R electrode pad, a first G electrode pad, and a first B electrode pad. A first electrode of a red LED is connected to each R electrode pad, a first electrode of a green LED is connected to each G electrode pad, and a first electrode of a blue LED is connected to each B electrode pad. Second electrodes of the red LED, the green LED, and the blue LED in each pixel are connected to the corresponding second electrode pads. The second electrodes are connected in common to the column-wise interconnection lines formed on the underlying second layer via the second vias. Thus, the red LED, the green LED, and the blue LED are arranged in the column direction D2 and are arrayed adjacent to one another in the row direction D1 in each pixel unit.

The row-wise interconnection lines 30a and 30b are formed on the first layer L10 to electrically connect the second electrode pads adjacent in the row direction D1. The via holes VH penetrate the first layer L10 to connect the first electrode pads to column-wise interconnection lines 31R, 31G, 31B, 32R, 32G, and 32B formed on the second layer L20. The second electrode pads are connected to the row-wise interconnection lines through the second vias (CV21 in (c) of FIG. 8).

The column-wise interconnection lines 31R, 31G, 31B, 32R, 32G, and 32B are formed on the second layer L20. In the column-wise interconnection lines, contacts RC11, RC21, GC11, GC21, RC11, GC21, RC12, GC12, BC12, RC22, GC22, and BC22 are formed at positions corresponding to the first electrode pads formed on the top layer TOP. The contacts have larger widths than the other portions of the column-wise interconnection lines. The contacts are connected to the first electrode pads through the second vias (RV11, GV11, and BV11 in (b) of FIG. 8).

As is apparent from the above description, the first electrodes of the LEDs are connected independently to the first electrode pads arrayed in the row direction in each pixel of the LED display module according to the present invention. Due to this construction, compact routing can be implemented and pixel intervals can be reduced.

In addition, the LED display module of the present invention is free from the problems encountered in conventional LED display modules including electrode pads whose cross-sectional shape is rectangular. Specifically, the solder balls melted during a reflow process do not flow into the edge areas of the electrode pads to prevent tilting of the LEDs mounted on the electrode pads, achieving improved yield of the LED display module.

What is claimed is:

1. An LED display module comprising: a micro-LED array comprising a plurality of pixel units arrayed in a matrix with rows and columns, each of the pixel units comprising a red LED, a green LED, and a blue LED; a substrate comprising a top layer on which the pixel units are mounted, a first layer located under the top layer, and a second layer located under the first layer; and pairs of electrode pads disposed on the substrate and to which first electrodes and second electrodes of the LEDs of the pixel units are connected, wherein the distances between peripheral portions of the paired electrode pads are longer than the distances between central portions thereof.

2. The LED display module according to claim 1, wherein the pairs of electrode pads comprise a plurality of first electrode pads to which the first electrodes of the LEDs of the pixel units are connected and a plurality of second electrode pads to which the second electrodes of the LEDs of the pixel units are connected.

3. The LED display module according to claim 2, wherein the plurality of first electrode pads corresponding to each pixel unit comprise a first R electrode pad, a first G electrode pad, and a first B electrode pad; and the plurality of second electrode pads corresponding to each pixel unit comprise a second R electrode pad, a second G electrode pad, and a second B electrode pad.

4. The LED display module according to claim 3, wherein the first electrode pads corresponding to one pixel unit and the first electrode pads corresponding to another pixel unit adjacent in the row direction receive scan signals applied through a common row-wise interconnection line; and the second electrode pads corresponding to one pixel unit are connected to the second electrode pads corresponding to another pixel unit adjacent in the column direction through a common column-wise interconnection line.

5. The LED display module according to claim 4, wherein the pairs of electrode pads are disposed on the top layer.

6. The LED display module according to claim 4, wherein the column-wise interconnection lines are formed on the second layer.

7. The LED display module according to claim 6, wherein the column-wise interconnection lines are connected to the first electrode pads through first vias.

8. The LED display module according to claim 7, wherein the outer circumference of the upper end of each of the first vias is within the outer circumference of the corresponding first electrode pad in the connection portion between the first electrode pad and the first via.

9. The LED display module according to claim 8, wherein each of the first electrode pads has a circular or n-gonal shape (n is a natural number of 5 or greater) in cross section.

10. The LED display module according to claim 4, wherein the row-wise interconnection lines are formed on the first layer.

11. The LED display module according to claim 10, wherein the row-wise interconnection lines are connected to the second electrode pads through second vias.

12. The LED display module according to claim 11, wherein the outer circumference of the upper end of each of the second vias is within the outer circumference of the corresponding second electrode pad in the connection portion between the second electrode pad and the second via.

13. The LED display module according to claim 12, wherein each of the second electrode pads has a circular or n-gonal shape (n is a natural number of 5 or greater) in cross section.

14. The LED display module according to claim 4, wherein the second R electrode pads adjacent in the column direction are linearly aligned, the second G electrode pads adjacent in the column direction are linearly aligned, and the second B electrode pads adjacent in the column direction are linearly aligned.

15. The LED display module according to claim 14, wherein each of the column-wise interconnection lines comprises three sub-lines consisting of an R line, a G line, and a B line.

16. The LED display module according to claim 15, wherein the second R electrode pads adjacent in the column direction are connected to the R line, the second G electrode pads adjacent in the column direction are connected to the G line, and the second B electrode pads adjacent in the column direction are connected to the B line.

17. The LED display module according to claim 4, wherein the number of the row-wise interconnection lines corresponds to the number of the rows.

18. The LED display module according to claim 17, wherein scan signals are sequentially applied to the common row-wise interconnection lines in response predetermined scan cycles.

19. The LED display module according to claim 4, wherein the number of the column-wise interconnection lines corresponds to the number of the columns.

20. The LED display module according to claim 2, wherein the first and second electrode pads corresponding to each pixel unit are arrayed in the row and column directions, respectively.

* * * * *